(12) United States Patent
Vahedi et al.

(10) Patent No.: US 6,841,943 B2
(45) Date of Patent: Jan. 11, 2005

(54) PLASMA PROCESSOR WITH ELECTRODE SIMULTANEOUSLY RESPONSIVE TO PLURAL FREQUENCIES

(75) Inventors: Vahid Vahedi, Albany, CA (US); Peter Loewenhardt, Pleasanton, CA (US); Albert Ellingboe, Dublin (IE); Andras Kuthi, Thousand Oaks, CA (US); Andreas Fischer, Castro Valley, CA (US)

(73) Assignee: Lam Research Corp., Fremont, CA (US)

( * ) Notice: Subject to any disclaimer, the term of this patent is extended or adjusted under 35 U.S.C. 154(b) by 0 days.

(21) Appl. No.: 10/180,978

(22) Filed: Jun. 27, 2002

(65) Prior Publication Data

US 2004/0000875 A1 Jan. 1, 2004

(51) Int. Cl.[7] ................................................. H01J 7/24
(52) U.S. Cl. ............................ 315/111.71; 315/111.21; 315/111.51; 315/111.81; 118/723 I
(58) Field of Search ....................... 315/111.21, 111.51, 315/111.81, 111.91, 111.71; 118/723, 723 I, 723 E, 723 R, 723 IR; 156/345, 643

(56) References Cited

U.S. PATENT DOCUMENTS

| 5,272,417 | A | * | 12/1993 | Ohmi ..................... 315/111.21 |
|---|---|---|---|---|
| 5,534,751 | A | | 7/1996 | Lenz et al. .............. 315/111.71 |
| 5,838,111 | A | * | 11/1998 | Hayashi et al. .......... 315/111.21 |
| 5,998,932 | A | | 12/1999 | Lenz ...................... 315/111.21 |
| 6,106,663 | A | | 8/2000 | Kuthi et al. ................. 156/345 |
| 6,199,505 | B1 | * | 3/2001 | Sato et al. ................ 118/723 E |
| 6,391,147 | B2 | * | 5/2002 | Imafuku et al. ............. 156/345 |
| 2003/0029567 | A1 | * | 2/2003 | Dhindsa ................. 315/111.21 |

* cited by examiner

Primary Examiner—James Vannucci
Assistant Examiner—Jimmy T. Vu
(74) Attorney, Agent, or Firm—Lowe Hauptman Gilman & Berner LLP

(57) ABSTRACT

A plasma in a vacuum chamber where a workpiece is processed is bounded by a plasma confinement volume including a region between a first electrode simultaneously responsive to power at first and second RF frequencies and a DC grounded second electrode. A DC grounded extension is substantially aligned with the first electrode. A substantial percentage of power at the first frequency is coupled to a path including the first and second electrodes but not the extension while a substantial percentage of power at the second frequency is coupled to a path including the first electrodes and extension, but not the second electrode. Changing the relative powers at the first and second frequencies, as applied to the first electrode, controls DC bias voltage of the first electrode.

70 Claims, 3 Drawing Sheets

PLASMA PROCESSOR WITH ELECTRODE SIMULTANEOUSLY RESPONSIVE TO PLURAL FREQUENCIES

FIELD OF INVENTION

The present invention relates generally to plasma processors with an electrode simultaneously responsive to plural frequencies. One particular aspect of the invention relates to a processor including a chamber having an arrangement for causing power at the plural frequencies to have substantially different paths through a region bounded by a pair of electrodes, one of which is simultaneously responsive to the plural frequencies and the other of which is substantially at a reference potential. Another aspect of the invention relates to a processor method and structure wherein a DC bias voltage at the electrode responsive to the plural frequencies is controlled by varying a parameter associated with power at one of the frequencies relative to a parameter associated with power at another of the frequencies.

BACKGROUND ART

Vacuum plasma processors are used to deposit materials on and etch materials from workpieces that are typically semiconductor, dielectric and metal substrates. A gas is introduced into a vacuum plasma processing chamber where the workpiece is located. The chamber pressure is typically in the range of 0.1 to 1000 torr. The gas is ignited in an excitation region into an RF plasma in response to an RF electric or electromagnetic field. The RF field is provided by a reactive impedance element, usually either an electrode array or a coil which couples both magnetic and electric RF fields to the gas. The reactive impedance element is connected to a first RF source having a first relatively high RF frequency and sufficient power such that the gas is ignited into the plasma. Connections between the first RF source and reactive impedance element are usually by way of a relatively long cable, connected directly to the first RF source. A first resonant matching network connected between the cable and reactive impedance element usually includes a pair of variable reactances adjusted to match the impedance of the first RF source to the load it is driving.

Typically, the gas is introduced into the chamber through the top of the chamber and is withdrawn from the bottom of the chamber. It is common for an electrode at the top of the chamber to be associated with a series of gas baffles and openings into the excitation region to provide a shower head effect for the gas flowing into the excitation region.

The workpiece is usually mounted on an electrode at the bottom of the excitation region. In some chambers, the electrode carrying the workpiece (frequently referred to as the bottom electrode) is the reactive impedance element supplied with the first RF frequency and another electrode spaced from the electrode carrying the workpiece (frequently referred to as the top electrode) is connected to a reference potential, typically ground. Processors with such configurations are frequently referred to as diodes because the chamber includes one powered electrode, a grounded wall structure and a grounded electrode.

In other processors, the top and bottom electrodes of the chamber are respectively powered by separate relatively high and low RF frequencies and the chamber wall structure is grounded. The relatively high frequency, which is in excess of 10 MHz and is typically 27 MHz, controls the density of the plasma, while the relatively low frequency, which is less than 10 MHz and is typically 2 MHz, controls the energy of ions in the plasma. Independent control of plasma density and ion energy is provided by independently controlling electric parameters, such as power, voltage and/or current, of the first and second RF sources. Chambers having this configuration, frequently referred to as triodes, also provide control for a DC bias voltage established on the bottom electrode. The DC bias voltage control results from an interaction between the plasma close to the top and bottom electrodes and RF fields the top and bottom electrodes couple into the plasma in response to the RF power applied to the top and bottom electrodes. By varying the relative values of parameters, e.g., current and/or voltage, or power, applied to the top and bottom electrodes, the bottom electrode DC bias voltage changes in a controllable monotonic manner so that as the high frequency power increases relative to the low frequency power, the magnitude of the DC bias voltage, which is negative, increases.

It is known for chambers having the foregoing diode and triode configurations to include a structure for confining the plasma to a confinement region including a volume between the electrodes. The confinement structure prevents the plasma from being incident on the chamber grounded metal wall structure, to thereby prevent substantial damage to the chamber wall structure and increase control of the plasma properties; see, e.g., Lenz et al., U.S. Pat. No. 5,534,751.

In still other chambers, wherein the top electrode and the chamber metal wall are connected to ground (a reference potential), relatively high and low RF frequency power is simultaneously supplied to the bottom electrode. The vacuum chamber grounded metal wall structure of such diode configurations usually defines the exterior of a region where the excited plasma subsists. In particular, Lenz, U.S. Pat. No. 5,998,932, discloses simultaneously supplying 2 MHz and 27 MHz to the bottom electrode of a chamber with a confinement structure and grounded top electrode and metal wall. Kuthi et al., U.S. Pat. No. 6,106,663, also discloses simultaneously supplying 2 MHz and 27 MHz to the bottom electrode of a chamber with a grounded top electrode.

Prior art processors with chambers having a configuration wherein high and low frequencies simultaneously drive the bottom electrode have been constructed in such a manner that the DC bias voltage on the bottom electrode is not controllable by varying the relative values of high and low frequency parameters, e.g., power, supplied to the bottom electrode. It has been found that the DC bias voltage remains relatively constant as the relative amounts of high and low frequency power supplied to the bottom electrode vary. We believe the bias voltage remains relatively constant because the chambers have been constructed so the ion energy (which is supposed to be controlled primarily by the low frequency power) is coupled substantially with the ion density (which is supposed to be controlled primarily by the high frequency power). Consequently, there is coupling of plasma density with the width of a sheath between the edges of the plasma volume and surfaces of the chamber close to the plasma edges. As a result, varying the relative values of a parameter (e.g., power) at the high and low frequencies has not resulted in the desired independent control over plasma ion energy and plasma density. Thus, the prior art diode chambers wherein two different frequencies are simultaneously applied to the bottom electrode have been unable to come close to achieving the degree of bottom electrode bias voltage control that triode dual frequency chambers have attained.

SUMMARY OF THE INVENTION

In accordance with one aspect of the invention, a plasma processor comprises a vacuum chamber having: (a) a port for coupling gas to the chamber, (b) a first electrode for applying electric fields to gas in the chamber, (c) a second electrode substantially at a DC reference potential, and (d) a region between the electrodes where the plasma subsists. The processor includes circuitry for causing the first electrode to simultaneously supply electric fields having plural frequencies to the plasma. The chamber includes an arrangement for causing the power at the different frequencies to have substantially different paths through the region between the electrodes where the plasma subsists.

Preferably, the first frequency (preferably about 2 MHz) primarily controls ion energy of the plasma and the second frequency (preferably about 27 MHz) primarily controls ion density of the plasma.

The chamber is preferably arranged for causing a substantial percentage of power at the first frequency to be coupled between the first and second electrodes and for preventing a substantial percentage of power at the second frequency to be coupled between the first and second electrodes.

Such a chamber arrangement preferably includes a distributed parameter filter arrangement having a path outside of the region. The path outside the region is arranged for coupling current from the second electrode to a terminal at the reference potential and is substantially at the reference potential. The path has an electrical length at the first frequency which is substantially less than the electrical length thereof at the second frequency such that the path outside the region has a substantially lower impedance at the first frequency than at the second frequency. The path outside the region has a structure for causing the path to have an inductive impedance at the first frequency that is approximately an order of magnitude less than the inductive impedance of the path at the second frequency.

The distributed parameter filter arrangement is also preferably arranged for passing the second frequency through the region to an extension of a wall of the chamber, wherein the extension is substantially at the same DC reference potential as the wall and second electrode. The wall extension is substantially closer to the first electrode than to the second electrode.

The extension preferably includes an area beyond a peripheral portion of the first electrode. Electrical coupling from the first electrode to the extension is arranged for passing the second frequency in the region to a greater extent than the first frequency is passed in the region. The extension is preferably spaced by a dielectric from the first electrode.

The structure for confining the plasma preferably includes a plurality of louvers arranged for enabling gas within the volume to flow to portions of the chamber outside of the region. The louvers and spaces between the louvers are preferably made of a material and arranged for enabling displacement current at the first frequency to flow from the second electrode to the reference potential while preventing the flow of substantial DC current.

A controller for pressure of the plasma in the region preferably includes an arrangement for controlling spacing of the louvers relative to another structure in the chamber.

Another aspect of the invention relates to a method of operating a plasma processor having an electrode simultaneously supplied with power at first and second frequencies. A DC voltage bias is established on the electrode in response to an interaction between the power supplied to the electrodes at the first and second frequencies and plasma in the vicinity of the electrode. The value of the DC bias voltage is controlled by varying a parameter associated with the power at the first frequency relative to a parameter associated with the power at the second frequency.

A further aspect of the invention relates to a plasma processor comprising an electrode in a processing chamber, and circuitry for simultaneously supplying power at first and second frequencies to the electrode. A DC bias voltage is established on the electrode in response to an interaction between the power supplied to the electrodes at the first and second frequencies and plasma in the vicinity of the electrode. The chamber is configured and the first and second frequencies are such that varying a parameter associated with the power at the first frequency relative to a parameter associated with the power at the second frequency causes a controllable change in the DC bias voltage.

Preferably, the parameter associated with the power at the first frequency is the amount of power at the first frequency and the parameter associated with power at the second frequency is the amount of power at the second frequency. Preferably, the first frequency (preferably about 2 MHz), primarily controls ion energy of the plasma and the second frequency (preferably about 27 MHz), primarily controls ion density of the plasma.

To assist in controlling the DC bias voltage, the power at the second frequency is preferably confined to a region that does not include a wall structure of a chamber of the processor, but does include a volume between the first and second electrodes. Power at the first frequency is supplied to a portion of the chamber substantially removed from the region to assist in controlling the DC bias voltage. The plasma is usually confined to the region to which power at the second frequency is confined. The pressure of plasma in the region is also controlled to assist in controlling the DC bias voltage.

To assist in providing better control of the DC bias voltage, the confined region for the second frequency extends to an area beyond a peripheral portion of the first electrode. The area beyond the peripheral portion of the first electrode preferably comprises: (1) a material, preferably an intrinsic semiconductor, for enabling displacement currents at the first and second frequencies to flow through it while preventing the flow of substantial DC current, and (2) a surface at a DC reference potential beyond a peripheral portion of the material.

The structure for confining the plasma preferably includes a plurality of louvers arranged for enabling gas within the region to flow to portions of the chamber outside of the region. Preferably, the louvers and spaces between the louvers are made of a material and arranged for enabling displacement current at the first frequency to flow from the second electrode to the reference potential while preventing the flow of substantial DC current.

An additional aspect of the invention concerns a plasma processor for processing a workpiece, wherein the processor comprises a vacuum chamber having an electrically conductive wall at a reference potential. The wall has a circular inner periphery coaxial with a longitudinal axis of the chamber. The chamber includes a first circular electrode including a circular workpiece holder, wherein the first electrode and the workpiece holder are coaxial with the chamber longitudinal axis. The chamber also includes a second, circular electrode coaxial with the chamber longitudinal axis, wherein the second electrode has inlets for gas to be converted into a plasma in the chamber. A confining structure in the chamber confines the plasma to a region that does not permit the plasma to be incident on the wall, but includes a volume between the electrodes. The confining structure enables gas to flow outwardly from the region. The chamber also has an outlet for gas flowing outwardly from the region. A lower boundary of the confinement region includes (1) the first electrode, (2) a ring coaxial with the chamber longitudinal axis, and (3) an annular surface coaxial with the chamber longitudinal axis, wherein the annular surface is substantially at the reference potential. The ring is interposed between the first electrode and the annular surface and is made of a material for enabling RF displacement current to flow in it while preventing the substantial flow of conductive current to flow in it. Circuitry simultaneously supplies power at plural frequencies to the first electrode. The wall is electrically connected to the second electrode and to the annular surface and has a length between the second electrode and the annular surface such that the wall provides a relatively low impedance to a first of the frequencies while providing a relatively high impedance to a second of the frequencies.

Preferably, the annular surface is a dielectric covering an electrically conductive member and the ring comprises an intrinsic semiconductor, e.g., silicon.

In a preferred embodiment, the plasma confining structure includes a plurality of spaced plasma confinement rings having inner peripheral surfaces coaxial with the chamber longitudinal axis and the second electrode has a surface forming an upper boundary of the confinement region. The inner peripheral surfaces of each of the confinement rings are substantially aligned with the periphery of the surface of the second electrode forming the boundary upper region, and the annular surface extends at least to the circumference of a circle aligned with the inner peripheral surfaces of the plasma confinement rings.

The chamber is also configured and the first and second frequencies are such that varying a parameter associated with the power at the first frequency relative to a parameter associated with the power at the second frequency causes a controllable change in DC bias voltage established on the first electrode in response to interaction between the power supplied to the first electrode at the first and second frequencies and plasma adjacent the first electrode.

The above and still further objects, features and advantages of the present invention will become apparent upon consideration of the following detailed description of a specific embodiment thereof, especially when taken in conjunction with the accompanying drawings.

DETAILED DESCRIPTION OF THE DRAWING

Figure 1:
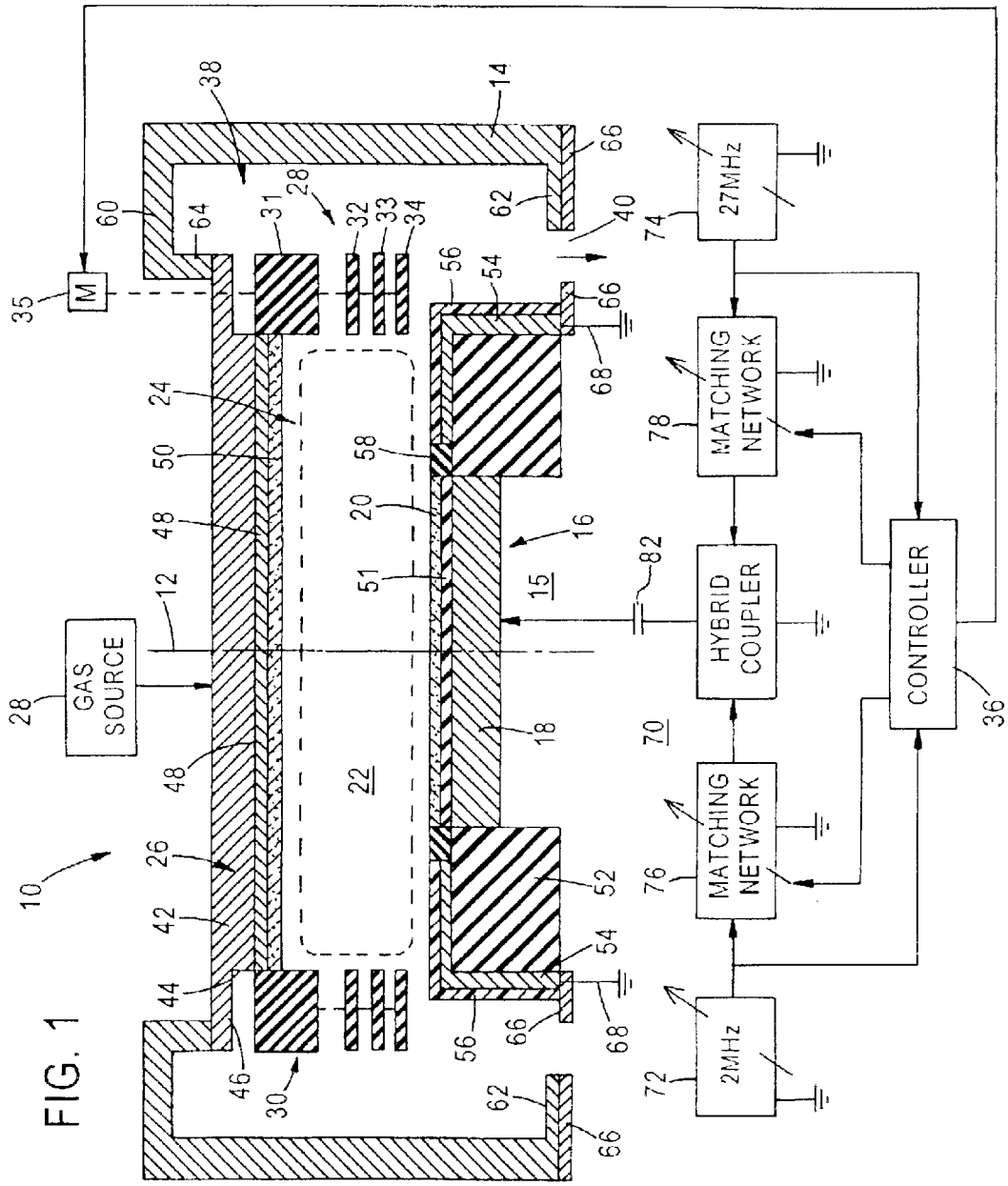
FIG. 1 is a partially schematic diagram of a preferred embodiment of a plasma processor in accordance with a preferred embodiment of the present invention.

Reference is now made to FIG. 1 of the drawing wherein plasma processor vacuum chamber 10 having a longitudinal axis, that is, centerline, 12 is illustrated as including electrically conductive metal wall 14 having a circular inner periphery coaxial with axis 12. Wall 14 is grounded, that is, at a DC reference potential.

Chamber 10 includes bottom assembly 15 comprising circular workpiece holder 16 including a first circular electrode 18, frequently referred to as a bottom electrode. Workpiece holder 16 and electrode 18 are coaxial with axis 12. Workpiece 20, typically a semiconductor wafer, is placed on holder 16 by a suitable mechanism (not shown) so that the workpiece is coaxial with axis 12 while the workpiece is being processed by plasma 22 that is confined to region 24 in chamber 10. Workpiece holder 16 is preferably configured as an electrostatic chuck connected to a suitable DC chucking voltage source (not shown). Workpiece holder 16 includes the usual workpiece lifting pins (not shown) and arrangement (not shown) for controlling the workpiece temperature.

Chamber 10 also includes second, circular electrode 26, which is electrically DC grounded and coaxial with axis 12. Electrode 26, frequently referred to as a top electrode, includes internal passages (not shown) and numerous showerhead openings (not shown), both connected in fluid flow relation to a suitable source 28 of one or more gases that flow through the showerhead openings into region 24 where the gases are converted into processing plasma 22.

Plasma 22 is confined to region 24 with the aid of confinement structure 28 comprising lower assembly 30 including four vertically stacked dielectric, preferably quartz, circular rings 31–34, which are fixedly connected with respect to each other by a suitable shaft arrangement (not shown). Rings 31–34 are coaxial with axis 12 and include aligned inner peripheries having substantially the same diameter as the diameter of electrode 26 which defines the uppermost face of plasma confinement region 24. Each of rings 31–34 has approximately the same horizontal extent, while upper ring 31 has a vertical extent substantially greater than the approximately equal vertical extents of rings 32–34. The inner periphery of upper ring 31 contacts the periphery of top electrode 26. The lower face of bottom ring 34 is usually spaced above the top face of lower assembly 15. Un-ionized gas, that is, gas that is not a plasma, flows from region 24 through louver assembly 30 as well as the space between ring 34 and bottom assembly 15. Motor 35, outside of chamber 10, includes a shaft (not shown) which extends through the chamber to drive rings 31–34 vertically with respect to the top face of bottom assembly 15. To control the pressure of plasma 22 in plasma confinement region 24, motor 35 is connected to be responsive to an output signal of controller 36, to drive rings 31–34 vertically and thereby control the spacing between ring 34 and the top face of bottom assembly 15. For maximum pressure, the bottom face of ring 34 rests on the top face of assembly 15.

The un-ionized gas flows from region 24 through louver assembly 30 into an annular volume 38 of chamber 10 between the outer edges of rings 31–34 and the inner periphery of wall 14. The plasma, being confined to region 24, is prevented from being incident on wall 14. The un-ionized gas in volume 38 flows through plural ports 40 at the bottom of volume 38, by virtue of ports 40 being connected to a suitable vacuum pump (not shown) which typically maintains the pressure in chamber 10 between 1 and 1000 millitorr.

Top electrode 26 is an assembly including metal, preferably aluminum, plate 42 that is coaxial with axis 12 and is connected to ground. Plate 42 includes vertically extending side edge 44 and radially extending flange 46. Flange 46 extends from the upper portion of edge 44 and has an outer diameter that is the same as the outer diameter of rings 31–34 so the outer peripheries of the flange and rings are vertically aligned. Edge 44 has a diameter that is the same as the inner diameters of rings 31–34 so the periphery of edge 44 is vertically aligned with the inner peripheries of rings 31=14 34. Graphite disk 48, coaxial with axis 12 and having the same diameter as edge 44, is bolted to plate 42 so that the bottom face of plate 42 and the top face of disk 48 abut. The top face of semiconductor disk 50 is coaxial with axis 12, has the same diameter as graphite disk 48 and is preferably made of intrinsic silicon. Disk 50 is bonded by a suitable adhesive agent to the bottom face of graphite disk 48.

Bottom assembly 15 includes electrode 18, having its top face covered by protective electrically insulating, oxide layer 51, and dielectric circular ring 52, preferably made of quartz. Ring 52, coaxial with axis 12, has an inner peripheral circular wall surface having substantially the same diameter as the aligned diameters of electrode 18 and workpiece 20, when the workpiece is in place on electrode 18. Metal, preferably aluminum, electrically grounded coating 54 covers the outer circular wall of ring 52 and extends inwardly from the outer wall of the ring toward the inner wall of the ring and the peripheral surface of workpiece 20. The inner edge of conductive coating 54 is circular, coaxial with axis 12 and spaced from the inner wall of ring 52. Dielectric layer 56, preferably quartz, covers the side and upper face of metal coating 54 and is at DC ground potential, by virtue of the dielectric layer contacting DC grounded metal coating 54. Consequentially, metal coating 54 and dielectric layer 56 are considered to be an extension of DC grounded metal wall 14.

Ring 58, made of an intrinsic semiconductor, preferably silicon, is mounted on the top face of ring 52. Ring 58 is dimensioned and located so it is interposed between the outer diameter of workpiece 20 and the aligned inner edges of metal coating 54 and dielectric layer 56. Ring 58 is mounted on ring 52 so that the outer edge of ring 58 abuts the inner edges of metal coating 54 and dielectric layer 56 and the inner edges of ring 58 and workpiece 20 almost touch when the workpiece is correctly positioned on workpiece holder 16. Ring 58, being made of an intrinsic semiconductor, provides a path for RF displacement current that flows between bottom electrode 18 and grounded electrode 26, including the extension of the grounded electrode including metal coating 54 and dielectric layer 56. However, the intrinsic semiconductor material of ring 54 does not provide a conductive path for DC current that might flow between electrodes 18 and 26, including the extension so that no substantial DC current flows across ring 58 between metal coating 54 and electrode 18 or workpiece 20.

Metal wall 14 includes upper and lower metal portions 60 and 62, each of which extends radially inward toward axis 12. The inner edge of upper metal portion 60 is electrically and mechanically connected to aluminum plate 42 by downwardly depending flange 64, while the inner edge of lower metal portion 62 is electrically and mechanically connected to metal coating 54. Metal ring 66, that includes openings or passages 40, is coaxial with axis 12 and is preferably made of high conductivity non-magnetic metal, e.g., copper or aluminum. Ring 66 has a lower face tied by metal straps 68 to ground. Ring 66 has an upper face connected to the lower metal portion 62 and coating 54. Thereby, coating 54 is ohmically (i.e., conductively or DC) connected to DC ground and maintained at substantially the same DC ground potential as wall 14.

Wall 14, including upper and lower metal portions 60 and 62, can be considered as a distributed parameter inductor which has a relatively low impedance at low RF frequencies (e.g., 2 MHz) and a relatively high impedance at high RF frequencies (e.g., 27 MHz). As such, wall 14 can be considered as a distributed parameter low pass filter that passes low RF frequencies and substantially blocks high RF frequencies.

Circuitry 70 simultaneously supplies power at plural RF frequencies to electrode 18. The RF frequencies are preferably 2 and 27 MHz, which respectively primarily control energy and density of ions in plasma 20. Hence, changes in the amount of power at 2 MHz result in variations in the ion energy of plasma 22, while changes in the amount of power at 27 MHz result in variations in the density of plasma 22. Because of the configuration of chamber 10, varying the power at 2 MHz relative to the power at 27 MHz or vice versa causes a controllable change in the DC bias voltage established on electrode 18 as a result of an interaction between the plasma and the 2 and 27 MHz electric fields that electrode 18 couples into the plasma in response to the 2 and 27 MHz power that circuitry 20 supplies to electrode 18. We have found that the configuration of chamber 10 enables a monotonic relationship to be achieved between the relative amounts of power at 2 and 27 MHz and the DC bias voltage of electrode 18. As the amount of power at 2 MHz increases relative to the amount of power at 27 MHz, there is an increase in the negative DC bias voltage of electrode 18. Hence, controlling the relative amounts of power at 2 and 27 MHz that is supplied to electrode 18 of the diode configuration of FIG. 1 provides a result somewhat similar to the result which is attained in a triode configuration wherein the top and bottom electrodes are separately powered at different frequencies and the chamber wall is grounded.

The diode configuration of FIG. 1 differs from typical prior art diode configurations wherein power at 2 and 27 MHz simultaneously drives the bottom electrode. In the diode chamber 10 of FIG. 1, a substantial percentage of the high frequency, 27 MHz power applied to electrode 18 has a path that includes electrode 18 and the grounded extension that metal coating 54 forms but does not include electrode 26. In contrast, a substantial percentage of the low frequency, 2 MHz power applied to electrode 18 has a path that includes electrode 18 and grounded electrode 26 but does not include metal coating 54. Wall 14 prevents a substantial amount of the 27 MHz power from reaching electrode 26 because of the appreciable inductive impedance of the wall at 27 MHz. Wall 14 has an inductive impedance at 2 MHz which is more than an order of magnitude less than the inductive impedance of the wall at 27 MHz so that there is substantial circulation of the 2 MHz power through the wall. The length of wall 14 between electrode 26 and coating 54 is such that wall 14 has an electrical length of approximately one wavelength at 27 MHz, and an electrical length of less than $\frac{1}{10}$ of wavelength at 2 MHz.

Chamber 10 has a substantially higher capacitive impedance to 2 MHz power coupled from electrode 18 to ground, through plasma 22 and semiconductor ring 58 and grounded coating 54 on the top face and outer side wall of dielectric ring 52 than to 27 MHz power coupled through the same path, i.e., the path through plasma 22, semiconductor ring 58 and metal coating 54. Ring 58 can be considered as a distributed impedance component having capacitive and resistive components. Plasma 22 can be considered primarily as a distributed resistance. There is a sheath between plasma 22 and the surfaces of confinement region 24, i.e., the top face of workpiece 20, the surfaces of rings 31–34, the bottom face of semiconductor disk 50, the tope face of dielectric layer 56 and the top face of semiconductor ring 58. Changes in the DC bias voltage of electrode 18 change the sheath thickness and the capacitance associated with the sheath. The sheath can be considered as a distributed impedance having primarily capacitive components. Hence the RF current flow from powered bottom electrode 18 to grounded metal straps 68 begins through the capacitive impedance of the sheath immediately above bottom assembly 15, and thence through the resistive plasma 22.

A first path for the RF current flowing through plasma 22 is through the capacitive impedance of the sheath immediately below top electrode assembly 26, thence through wall 14 and ring 66 to grounded strap 68. A second path for the RF current flowing through plasma 22 is through the capacitive impedance of the sheath above bottom electrode 18 into capacitive and resistive semiconductor ring 58, thence to strap 68 via conductive coating 54. A third path for the RF current flowing through plasma 22 is through the capacitive impedance of the sheath above bottom assembly 15 into the capacitive impedance of layer 56, thence to strap 68 via conductive coating 54. The capacitive impedances of the sheath, layer 56 and ring 58 are an order of magnitude less for the 27 MHz current flowing from bottom electrode 18 to grounded straps 68 than for the 2 MHz current. The impedance of the third path is also lower for the 27 MHz excitation than for the 2 MHz excitation because the area of conductive coating 54 on the top face of ring 52 functions similar to a capacitor electrode. Because the value of a capacitor is directly proportional to the area of an electrode of the capacitor and the impedance of a capacitor is inversely proportional to the product of the frequency applied to the capacitor and the value of the capacitor, ring 52 has a much lower impedance to 27 MHz than to 2 MHz. At 27 MHz, there is a much lower impedance from electrode 18 to ground straps 68 through plasma 22, metal coating 54 on the top face of dielectric ring 52 and semiconductor ring 58 than the path from electrode 18 to ground straps 68 through plasma 22, electrode 26 and wall 14.

It was found from actual experiments that increasing the grounded electrode area essentially bounding confinement region 24 (including electrode 26 and the extension thereof comprising metal coating 54 on the top face of dielectric ring 52) relative to the area of powered electrode 18 causes substantial increases in the amount of DC bias voltage control that results from changing the relative power supplied to electrode 18 at 2 MHz and 27 MHz. In one preferred embodiment, as illustrated in FIG. 2, the ratio of the grounded electrode area to the powered electrode area was 2.7:1.

Circuitry 70, in the illustrated embodiment, includes variable power 2 MHz source 72 and variable power 27 MHz source 74 which respectively drive matching networks 76 and 78, respectively tuned to 2 MHz and 27 MHz. Hybrid coupler 80 has first and second inputs respectively connected to be responsive to the RF outputs of matching networks 76 and 78 so that the coupler derives an output that is a linear combination of the outputs of the matching networks. The output of coupler 80 is supplied via coupling capacitor 82 to electrode 18 so the electrode is simultaneously driven by power at 2 MHz and 27 MHz.

Each of matching networks 76 and 78 includes a pair of variable reactances having values controlled by controller 36. Controller 36 responds to signals a probe (not shown) derives indicative of the voltage, current and phase angle of the 2 MHz energy that matching network 76 reflects back toward 2 MHz source 72 to control the reactances of matching network 76. Controller 36 also responds to signals a probe (not shown) derives indicative of the voltage, current and phase angle of the 27 MHz energy that matching network 78 reflects back toward 27 MHz source 74 to control the reactances of matching network 78. Networks 76 and 78 and RF sources 72 and 74 have sufficiently high Qs (quality factor) to prevent coupling of possibly damaging 27 MHz power to 2 MHz source 72 and to prevent coupling of possibly damaging 2 MHz power to 27 MHz source 74. The relative powers that RF sources 72 and 74 supply to electrode 18 are controlled to provide independent control of the energy of ions in the plasma and the density of ions in the plasma, and to control the DC bias voltage of bottom electrode 18.

Figure 2:
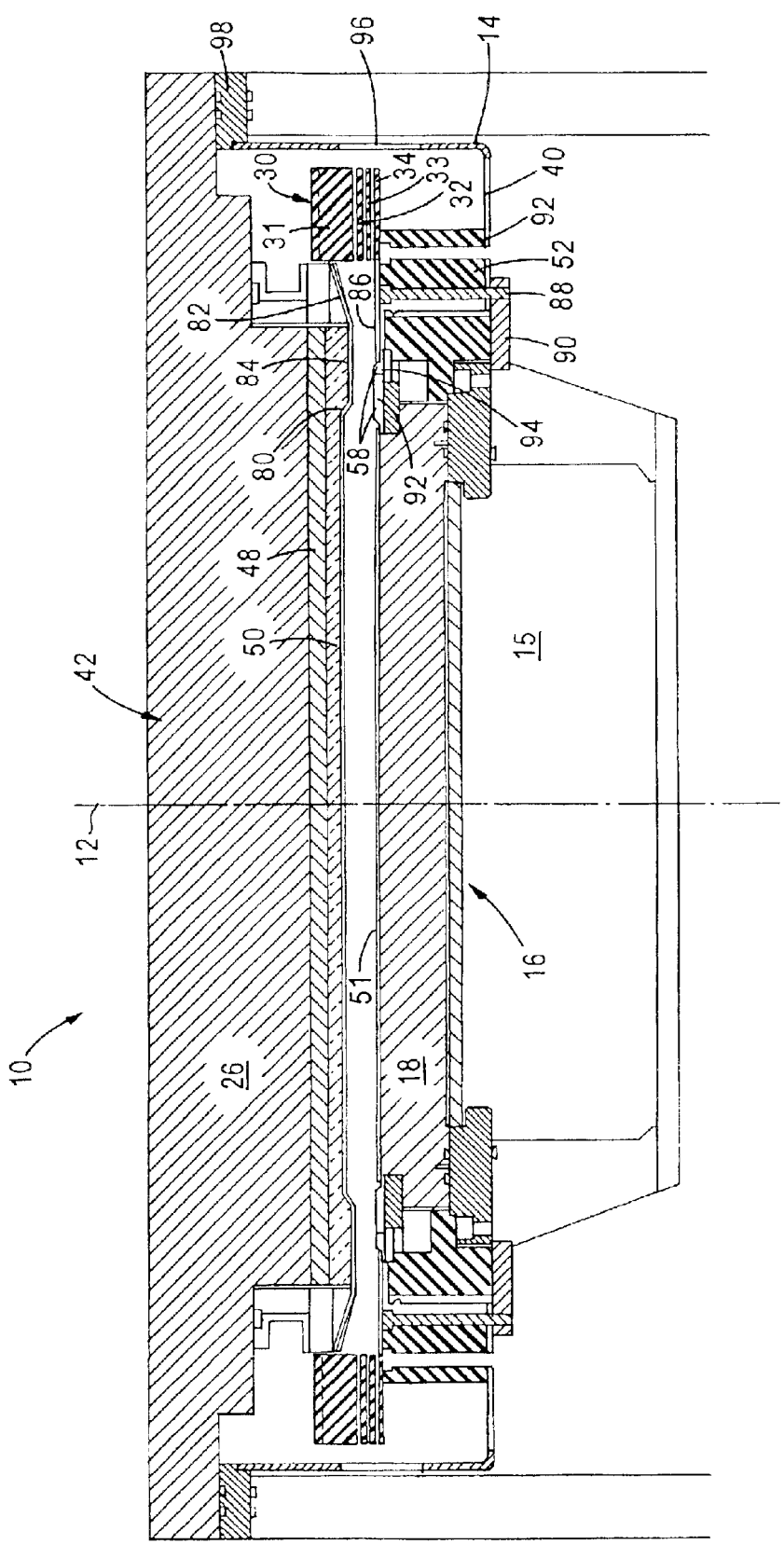
FIG. 2 is a cross-sectional view of a preferred embodiment of the plasma processor vacuum chamber schematically illustrated in FIG. 1.

Reference is now made to FIG. 2 of the drawing, a mechanical cross-sectional view of the structure schematically illustrated in FIG. 1. To slightly increase the surface area of grounded upper electrode 26 in confinement region 24, the lower face of graphite disk 48 and semiconductor disk 50 include tapered surfaces 80 and 82 that respectively extend downwardly into region 24 from the center and peripheral portions of electrode 26. Disks 48 and 50 include flat surface 84 that is between tapered surfaces 80 and 82 and extends parallel to the upper face of bottom electrode 16.

The extension of the grounded electrode, indicated in FIG. 1 by metal layer 54 on the top face of ring 52, is provided in FIG. 2 by metal (e.g., aluminum or copper) ring 86 that is bonded to the top face of quartz ring 52. Ring 86 is electrically connected to the grounded terminal of excitation circuitry 70 by several metal (e.g., aluminum or copper) posts 88 that extend through vertical cylinders in quartz ring 52. Posts 88 are equispaced every few degrees around ring 52. The upper face of each of posts 88 is mechanically and electrically bonded, e.g., by solder, to the lower face of ring 86. The lower end of each of posts 88 extends below the lower face of quartz ring 52 into mechanical and electrical engagement with the side walls of cylinders of grounded metal (e.g., aluminum or copper) electrical contact ring 90, to which the grounded terminals of excitation circuitry 90 are connected. Posts 88 and ring 90 thus provide the same function as the side wall of layer 54 on ring 52 and metal strap 68 in FIG. 1. Ring 90 and posts 88 are mechanically and electrically connected to horizontally extending metal plate 92 of chamber wall 14. Metal plate 92 is the equivalent of lower wall portion 62 and ring 66, FIG. 1.

Semiconductor ring 58, interposed between the periphery of bottom powered electrode 18 and the inner circumference of ring 86, includes two interfitting ridged segments 92 and 94, that are spaced radially with respect to each other to provide for thermal expansion.

As illustrated in FIG. 2, wall 14 includes viewing window 95. Metal ring 98 is mechanically and electrically connected to wall 14 and plate 42 and performs the function of upper wall portion 60, FIG. 1.

In one actually constructed chamber 10 having the FIG. 2 configuration, disk 50 had a diameter of 11 ½", electrode 51 had a diameter of 7 ¼" between its edges abutting semiconductor segment 92, ring 86 had a 1" spacing between its inner and outer diameters, ring 58 formed segments 92 and 94 and had a ¾" spacing between its inner and outer diameters, the diameter of wall 14 at window 96 was 12¾" and the spacing between the planar faces of electrodes 16 and 26 along axis 12 was ⅜". These dimensions resulted in a 2.7:1 area ratio of the grounded electrode to the powered electrode in confinement region 24. The grounded electrode area consists of the bottom face of silicon disk 50 and the upper face of metal ring 86, while the powered electrode area consists of the upper face of electrode 18.

Figure 3:
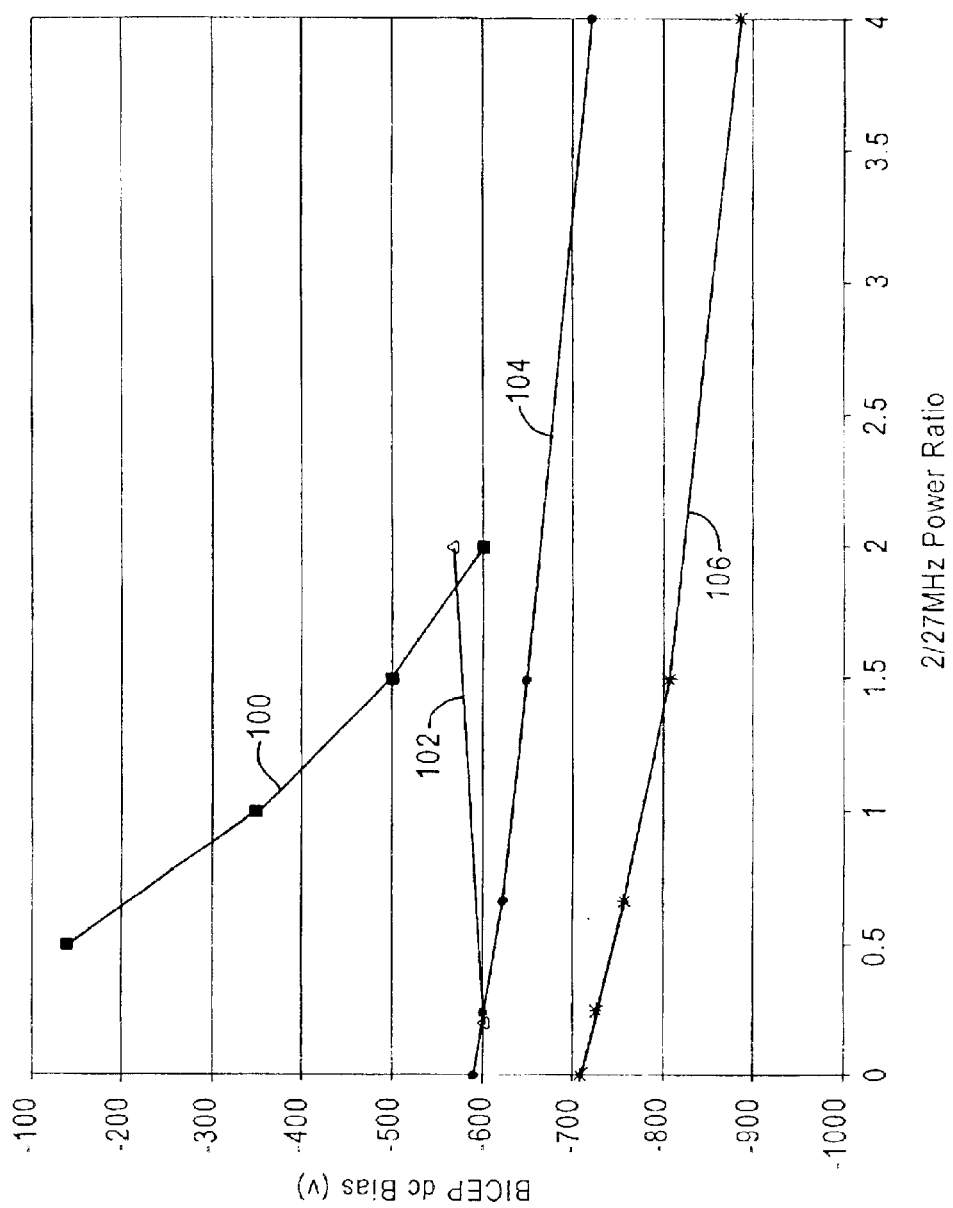
FIG. 3 is a graph indicating how DC bias voltage is controlled as a function of power of the two RF frequencies supplied to a bottom electrode of the chamber illustrated in FIG. 2.

Reference is now made to FIG. 3 of the drawing, which includes a series of plots indicating the performance of the structure of FIG. 2 vis-à-vis other devices. In FIG. 3, DC bias voltage associated with electrode 18 is plotted against the ratio of the 2 MHz to 27 MHz powers that circuitry 70 supplies to electrode 16.

Plot 100 is a monotonic function of DC bias voltage relative to the power ratio applied to a triode chamber in accordance with the prior art, wherein 2 MHz power is applied to the bottom electrode, 27 MHz power is applied to the top electrode, and the chamber wall is grounded. Plot 100 has a relatively large negative slope and indicates significant control is provided over DC bias voltage of the bottom electrode by varying the ratio of the power supplied to the top and bottom electrodes. In other words, changing the ratio of the 2 MHz power supplied to the bottom electrode relative to the 27 MHz power supplied to the top electrode resulted in a significant change in the DC bias voltage of the bottom electrode.

In contrast, plot 102 is indicative of the performance of a typical prior art diode chamber, wherein 2 MHz and 27 MHz powers are simultaneously supplied to the bottom electrode, the top electrode is grounded and the chamber wall is grounded. Plot 102 is not monotonic and has a very small slope, which is negative for power ratios in which the 27 MHz power is at least twice as high as the 2 MHz power. Plot 102 has a positive slope for power ratios in which the amount of 27 MHz power is less than approximately twice as much as the 2 MHz power. Consequently, no significant bottom electrode DC bias voltage control can be obtained with chambers that are configured to produce the results indicated by plot 102.

Plots 104 and 106 indicate the performance of the chamber illustrated in FIG. 2 for pressures of 120 millitorr and 67 millitorr, respectively. Both of plots 104 and 106 are monotonic functions, having negative slopes which are sufficient to enable control of the DC bias voltage of bottom electrode 18 in response to variations in the relative amounts of power at 2 MHz and 27 MHz applied to the bottom electrode. For example, plot 104 indicates that if no 2 MHz power is applied to electrode 18, while 1000 watts at 27 MHz is applied to electrode 18, the DC bias voltage of bottom electrode 18 is −590 volts. As the 2 MHz power increases, so that the 2 MHz power and the 27 MHz power are both 1000 watts, the DC bias voltage of electrode 18 is approximately −630 volts. As the 2 MHz power increases further, so that the 2 MHz power is 2000 watts and the 27 MHz power is 1000 watts, the DC bias voltage of electrode 18 decreases further, to approximately −670 volts. When the 2 MHz power is 4000 watts and the 27 MHz power is 1000 watts, the DC bias voltage of bottom electrode 18 decreases further to approximately −725 volts. Hence, with a chamber having the configuration of FIG. 2, changing the relative amounts of power applied to bottom electrode 18 at 2 MHz and 27 MHz provides substantial control of the DC bias voltage of the bottom electrode, with resulting independent control of plasma density and ion energy. Similar results are provided for 67 millitorr pressure indicated by plot 106.

While there has been described and illustrated a specific embodiment of the invention, it will be clear that variations in the details of the embodiment specifically illustrated and described may be made without departing from the true spirit and scope of the invention as defined in the appended claims.

We claim:

1. A plasma processor comprising a vacuum chamber having: (a) a port for coupling gas to the chamber, (b) a first electrode for applying electric fields to gas in the chamber, (c) a second electrode spaced from the first electrode, the second electrode being at a DC reference potential, the chamber being arranged for causing the gas to be excited to a plasma in a region including a volume between the electrodes; circuitry for causing the first electrode to simultaneously supply electric fields having different frequencies to the plasma; the chamber including an arrangement for causing power at the different frequencies to take substantially different paths through the region.

2. The plasma processor of claim 1 wherein the chamber arrangement is arranged for causing a substantial percentage of power at a first frequency to be coupled between the first and second electrodes and preventing a substantial percentage of power at a second frequency to be coupled between the first and second electrodes.

3. The plasma processor of claim 2 wherein the first frequency primarily controls ion energy of the plasma and the second frequency primarily controls ion density of the plasma.

4. The plasma processor of claim 3 wherein the first and second frequencies are respectively about 2 MHz and 27 MHz.

5. The plasma processor of claim 2 wherein the chamber arrangement includes a distributed parameter filter arrangement having a path outside of the region, the path outside the region being arranged for coupling current from the second electrode to a terminal at the reference potential, the path outside the region being substantially at the DC reference potential and having an electrical length at the first frequency which is substantially less than the electrical length thereof at the second frequency such that the path outside the region has a substantially lower impedance at the first frequency than at the second frequency.

6. The plasma processor of claim 5 wherein the electrical length of the path outside the region at the first frequency is a fraction of a wavelength of the first frequency and the electrical length of the path outside the region at the second frequency is approximately a wavelength of the second frequency.

7. The plasma processor of claim 5 wherein the path outside the region has a structure for causing the path to have an inductive impedance at the first frequency that is approximately an order of magnitude less than the inductive impedance of the path at the second frequency.

8. The plasma processor of claim 5 wherein the distributed parameter filter arrangement is also arranged for passing the second frequency through the region to an extension of the path, the extension being substantially at the DC reference potential and being substantially closer to the first electrode than to the second electrode.

9. The plasma processor of 8 wherein the extension includes an area beyond a peripheral portion of the first electrode, electrical coupling from the first electrode to the area beyond the peripheral portion being arranged for passing the second frequency in the region to a greater extent than the first frequency is passed in the region.

10. The plasma processor of claim 9 wherein the extension is spaced by a dielectric from the first electrode.

11. The plasma processor of claim 2 wherein the chamber arrangement includes an extension arrangement substantially at the DC reference potential, the first and second electrodes and the extension arrangement being arranged so that a substantial percentage of the power applied to the first electrode at a first frequency is not coupled to the extension arrangement and a substantial percentage of the power applied to the first electrode at a second frequency is coupled to the extension arrangement.

12. The plasma processor of claim 11 wherein the first and second electrodes and the extension arrangement are arranged so that a substantial percentage of the power at the first frequency is coupled to the second electrode.

13. The plasma processor of claim 11 wherein the extension arrangement is substantially closer to the first electrode than the second electrode.

14. The plasma processor of 11 wherein the extension arrangement includes an area beyond a peripheral portion of the first electrode, electrical coupling from the first electrode to the area beyond the peripheral portion being arranged for passing the second frequency in the region to a greater extant than the first frequency is passed in the region.

15. The plasma processor of claim 11 wherein the extension arrangement is spaced by a dielectric from the first electrode.

16. The plasma processor of claim 1 wherein the chamber arrangement includes a structure arrangement for confining the plasma substantially to the region and for enabling gas in the plasma confining structure arrangement to escape from the region to an exhaust port in the chamber.

17. The plasma processor of claim 16 wherein the region extends to a volume beyond a peripheral portion of the first electrode.

18. The plasma processor of claim 17 wherein the volume beyond the peripheral portion of the first electrode comprises: (a) a material for enabling displacement currents to flow through it while preventing the flow or substantial DC current, and (b) a surface substantially at a reference potential beyond a peripheral portion of the material.

19. The plasma processor of claim 18 wherein the material comprises an intrinsic semiconductor.

20. The plasma processor of claim 18 wherein the structure for confining the plasma includes a plurality of louvers arranged for enabling gas within the volume to flow to portions of the chamber outside of the region.

21. The plasma processor of claim 20 wherein the louvers and spaces between the louvers are made of a material and arranged for enabling displacement current to flow from the second electrode to the reference potential while preventing the flow of substantial DC current.

22. The plasma processor of claim 21 further including a controller for pressure of the plasma in the region.

23. The plasma processor of claim 1 wherein the region extends to a volume beyond a peripheral portion of the first electrode.

24. The plasma processor of claim 23 wherein the volume beyond the peripheral portion of the first electrode comprises: (a) a material for enabling displacement currents at the first and second frequencies to flow through it while preventing the flow of substantial DC current, and (b) a surface at a reference potential beyond a peripheral portion of the material.

25. A method of operating a plasma processor having a first electrode comprising the steps of simultaneously supplying power at first and second frequencies to the first electrode, a DC bias voltage being established on the first electrode in response to an interaction between the power supplied to the electrodes at the first and second frequencies and plasma in the vicinity of the first electrode, and controlling the value of the DC bias voltage to a desired value by varying a parameter associated with the power at one of said frequencies relative to a parameter associated with the power at the other of said frequencies.

26. The method of claim 25 wherein the parameter associated with the power at one of said frequencies is the amount of power applied to the first electrode at said first frequency and the parameter associated with power at the second frequency is the amount of power at the second frequency.

27. The method of claim 26 wherein the first frequency primarily controls ion energy of the plasma and the second frequency primarily controls ion density of the plasma.

28. The method of claim 27 wherein the first and second frequencies are respectively about 2 MHz and 27 MHz.

29. The method of claim 26 wherein the processor includes a second electrode, further including substantially confining the power at the first and second frequencies to a region including a volume between the first and second electrodes and causing substantial percentages of the power at the first and second frequencies applied to the first electrode to have substantially different paths in the region.

30. The method of claim 29 wherein the path at the first frequency includes the first and second electrodes and the path at the second frequency does not include the second electrode.

31. The method of claim 30 wherein the processor includes an extension at substantially the same DC potential as the second electrode and closer to the first electrode than the second electrode, wherein the path at the second frequency includes the first electrode and the extension.

32. The method of claim 29 further including confining the plasma to the region.

33. The method of claim 32 further including controlling the pressure of plasma in the region.

34. A plasma processor comprising a first electrode in a processing chamber, circuitry for simultaneously supplying power at first and second frequencies to the first electrode, a DC bias voltage being established on the first electrode in response to an interaction between the power supplied to the electrodes at the first and second frequencies and plasma in the vicinity of the electrode, the chamber being configured and the first and second frequencies being such that varying a parameter associated with the power at the first frequency relative to a parameter associated with the power at the second frequency causes a controllable change in the DC bias voltage for enabling the DC bias voltage to have a desired value.

35. The plasma processor of claim 34 wherein the parameter associated with the power at the first frequency is the amount of power at said one frequency and the parameter associated with power at the second frequency is the amount of power at the second frequency.

36. The plasma processor of claim 35 wherein the first frequency primarily controls ion energy of the plasma and the second frequency primarily controls ion density of the plasma.

37. The plasma processor of claim 36 wherein the first and second frequencies are respectively about 2 MHz and 27 MHz.

38. The plasma processor of claim 35 wherein the chamber includes a second electrode, and is configured for substantially confining the power at the first and second frequencies to a region including a volume between the first and second electrodes and causing substantial percentages of the power at the first and second frequencies applied to the first electrode to have substantially different paths in the region.

39. The plasma processor of claim 38 wherein the chamber (a) includes an extension arranged to be at substantially the same DC voltage as the second electrode and (b) is configured for causing the path at the second frequency to include the extension.

40. The plasma processor of claim 38 wherein the chamber includes a structure for confining the plasma to a region including the volume.

41. The plasma processor of claim 40 wherein the chamber includes a controller for the pressure of plasma in the region.

42. The plasma processor of claim 39 wherein the extension is (a) closer to the first electrode than to second electrode and (b) beyond a peripheral portion of the first electrode.

43. The plasma processor of claim 42 wherein the first electrode and the extension are spaced from each other by a material for enabling displacement currents to flow through the material while preventing the flow of substantial DC current.

44. The plasma processor of claim 43 wherein the material comprises an intrinsic semiconductor.

45. The plasma processor of claim 40 wherein the structure for confining the plasma includes a plurality of louvers arranged for enabling un-ionized gas within the region to flow to portions of the chamber outside the region.

46. The plasma processor of claim 45 wherein die louvers and spaces between the louvers are made of a material and arranged for enabling displacement current to flow from the second electrode to the reference potential while preventing the flow of substantial DC current.

47. A plasma processor for processing a workpiece comprising a vacuum chamber having electrically conductive wall at a DC reference potential, the wall having a circular inner periphery coaxial with a longitudinal axis of the chamber, the chamber including: (a) a first circular electrode including a circular workpiece holder; the first electrode and the workpiece holder being coaxial with the chamber longitudinal axis; (b) a second, circular electrode coaxial with the chamber longitudinal axis, the second electrode including inlets for gas to be converted into a plasma in the chamber; (c) a structure for confining the plasma to a region including a volume between the electrodes and for enabling gas to flow outwardly from the region, the structure being arranged for substantially preventing the plasma from being incident on the wall; (d) an outlet for gas flowing outwardly from the region; a lower boundary of the region including (i) the first electrode, (ii) a ring coaxial with the chamber longitudinal axis, and (iii) an annular surface coaxial with the chamber longitudinal axis, the annular surface being substantially at the DC reference potential; the ring being interposed between the first electrode and the annular surface and being made of a material for enabling RF displacement current to flow therein while preventing the substantial flow of conductive current therein; and circuitry for simultaneously supplying power at plural frequencies to the first electrode; the wall being conductively connected to the second electrode and to the annular surface and having a length and electrical inductance between the second electrode and the annular surface such that the wall provides a relatively low impedance to a first of the frequencies while providing a relatively high impedance to a second of the frequencies, the second frequency being substantially higher than the first frequency.

48. The processor of claim 47 wherein the annular surface is a dielectric covering an electrically conductive member.

49. The processor of claim 48 wherein the ring comprises an intrinsic semiconductor.

50. The processor of claim 49 wherein the structure for confining the plasma includes a plurality of spaced plasma confinement rings having inner peripheral surfaces coaxial with the chamber longitudinal axis, the second electrode having a surface forming an upper boundary of the region, the inner peripheral surfaces of each of the confinement rings being substantially aligned with the periphery of the surface of the second electrode forming the boundary upper region, the annular surface extending at least to the circumference of a circle aligned with the inner peripheral surfaces of the plasma confinement rings.

51. The processor of claim 50 wherein the plurality of spaced plasma confinement rings comprise a dielectric.

52. The plasma processor of claim 51 wherein the first frequency primarily controls ion energy of the plasma and the second frequency primarily controls ion density of the plasma.

53. The plasma processor of claim 52 wherein the first and second frequencies are respectively about 2 MHz and 27 MHz.

54. The processor of claim 50 further including a controller for changing the position of the confinement rings and for thereby changing the pressure of the plasma in the region.

55. The processor of claim 47 wherein the chamber is configured and the first and second frequencies are such that varying a parameter associated with the power at one of said frequencies relative to a parameter associated with the power at the other said frequencies causes a controllable change in a DC bias voltage established on the first electrode in response to interaction between the power supplied to the first electrode at the first and second frequencies and plasma adjacent the first electrode.

56. The processor of claim 55 wherein the parameter associated with the power at said first frequency is the amount of power at said first frequency and the parameter associated with power at said second frequency is the amount of power at the second frequency.

57. The processor of claim 56 wherein the first frequency primarily controls ion energy of the plasma and the second frequency primarily controls ion density of the plasma.

58. A plasma processor for processing a workpiece comprising a vacuum chamber having an electrically conductive wall, the wall having a circular inner periphery coaxial with a longitudinal axis of the chamber, the chamber including: (a) a first circular electrode including a circular workpiece holder; the first electrode and the workpiece holder being coaxial with the chamber longitudinal axis; (b) a second, circular electrode coaxial with the chamber longitudinal axis having a conductive connection to a first end of the wall, the second electrode including outlets for gas to be converted into a plasma in the chamber, (c) a structure for confining the plasma to a region including a volume between the electrodes and for enabling un-ionized gas to flow outwardly from the region, the structure being arranged for substantially preventing the plasma from being incident on the wall; and (d) an outlet for gas flowing outwardly from the region; a lower boundary of the region including (i) the first electrode, (ii) a ring coaxial with the chamber longitudinal axis, and (iii) an annular surface coaxial with the chamber longitudinal axis, the annular surface having a conductive connection to a second end of the wall; the ring being interposed between the first electrode and the annular surface and being made of a material for enabling RF displacement current to flow therein while preventing the substantial flow of conductive current therein; and circuitry for simultaneously supplying power at plural frequencies to the first electrode; the chamber being configured and first and second of said frequencies being such that varying a parameter associated with the power at said first frequency relative to a parameter associated with the power at said second frequency causes a controllable change in DC bias voltage established on the first electrode in response to interaction between the power supplied to the first electrode at the first and second frequencies and plasma adjacent the first electrode.

59. The processor of claim 58 wherein the parameter associated with the power at said first frequency is the amount of power at said first frequency and the parameter associated with power at said second frequency the amount of power at the second frequency.

60. The processor of claim 59 wherein the first frequency primarily controls ion energy of the plasma and the second frequency primarily controls ion density of the plasma.

61. A plasma processor comprising a vacuum chamber having: (a) a wall; (b) a port for coupling gas to the chamber, (c) an electrode assembly for applying electric fields to gas in the chamber, the electrode assembly including a first electrode and an extension spaced from and surrounding the first electrode, (d) a second electrode spaced from the first electrode, the first and second electrodes and the extension being spaced from and inside the wall, the chamber being arranged for causing the gas to be excited to a plasma in a region including a volume between the first and second electrodes, circuitry for simultaneously exciting the first electrode with plural frequencies for causing electric fields having different frequencies to be simultaneously supplied to the plasma; the first and second electrodes and the extension and the frequencies being such that power at a first of the frequencies has paths between the first and second electrodes and the extension that is substantially different from paths in the region of power at a second of the frequencies.

62. The processor of claim 61 wherein the chamber, including the electrodes and the extension, is arranged for (a) causing a substantial percentage of power at the first frequency to be coupled between the first and second electrodes and (b) preventing a substantial percentage of power at the second frequency to ha coupled between the first and second electrodes.

63. The processor of claim 62 wherein the extension is at a DC reference potential.

64. The processor of claim 61 wherein the extension is at a DC reference potential.

65. The processor of claim 64 wherein the frequencies and the chamber arrangement, including the electrodes and the extension, are such that (a) the path at the first frequency has a substantial percentage of power between the first electrode and the extension and a substantially lower percentage of power between the first and second electrodes and (b) the path at the second frequency has a substantial percentage of power between the first and second electrodes and a substantially lower percentage of power between first electrode and the extension.

66. The processor of claim 65 wherein the second electrode is at the DC reference potential.

67. The processor of claim 61 wherein the second electrode is at the DC reference potential.

68. The processor of claim 61 wherein the first electrode and the extension are below the second electrode.

69. The processor of claim 68 further including a structure for (a) confining the plasma, (b) substantially preventing the plasma from being incident on the chamber wall, and (c) providing a flow path for un-ionized gas in the region to an outlet in the chamber outside the confinement structure, the first and second electrodes and the extension being inside the confining structure.

70. The processor of claim 61 further including a structure for (a) confining plasma, (b) substantially preventing the plasma from being incident on the chamber wall, and (c) providing a flow path for un-ionized gas in the region to an outlet in the chamber outside the confinement structure, the first and second electrodes and the extension being inside the confining structure.

* * * * *